(12) United States Patent
Tang et al.

(10) Patent No.: US 11,048,163 B2
(45) Date of Patent: Jun. 29, 2021

(54) INSPECTION METHOD OF A PHOTOMASK AND AN INSPECTION SYSTEM

(71) Applicant: Taiwan Semiconductor Manufacturing Co., Ltd., Hsinchu (TW)

(72) Inventors: Tsun-Cheng Tang, Tainan (TW); Cheng-Ming Lin, Yunlin County (TW); Sheng-Chang Hsu, New Taipei (TW); Hao-Ming Chang, Pingtung (TW); Waylen Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 198 days.

(21) Appl. No.: 15/832,752

(22) Filed: Dec. 5, 2017

(65) Prior Publication Data
US 2019/0137869 A1   May 9, 2019

Related U.S. Application Data

(60) Provisional application No. 62/582,320, filed on Nov. 7, 2017.

(51) Int. Cl.
*G03F 1/84*   (2012.01)
*G03F 1/42*   (2012.01)
(Continued)

(52) U.S. Cl.
CPC ............ *G03F 1/84* (2013.01); *G01B 11/02* (2013.01); *G01N 21/8806* (2013.01);
(Continued)

(58) Field of Classification Search
None
See application file for complete search history.

(56) References Cited

U.S. PATENT DOCUMENTS 4,247,203 A * 1/1981 Levy .................. G03F 1/84
356/390
4,926,489 A   5/1990 Danielson et al.
(Continued)

OTHER PUBLICATIONS

Syed Rizvi, Handbook of photomask manufacturing technology, CRC Press, published in 2005, pp. 589, 591, 592.

*Primary Examiner* — Kara E. Geisel
*Assistant Examiner* — Jarreas C Underwood
(74) *Attorney, Agent, or Firm* — JCIPRNET

(57) ABSTRACT

In accordance with some embodiments of the present disclosure, an inspection method of a photomask includes performing a first inspection process, unloading the photomask from the inspection system, and performing a second inspection process. In the first inspection process, a common Z calibration map of an objective lens of an optical module with respect to the photomask is generated and stored, and a first image of the photomask is captured by using an image sensor while focusing the objective lens of the optical module based on the common Z calibration map. The photomask is unloaded from the inspection system. In the second inspection process, the photomask is loaded on the inspection system and a second image of the photomask is captured by using an image sensor while focusing an objective lens of an optical module based on the common Z calibration map generated in the first inspection process.

20 Claims, 13 Drawing Sheets

(51) Int. Cl.
*G03F 7/20* (2006.01)
*G01N 21/95* (2006.01)
*G01B 11/02* (2006.01)
*G01N 21/88* (2006.01)

(52) U.S. Cl.
CPC .......... *G01N 21/9501* (2013.01); *G03F 1/42* (2013.01); *G03F 7/2002* (2013.01); *G01N 2021/8835* (2013.01); *G01N 2201/127* (2013.01)

(56) References Cited

U.S. PATENT DOCUMENTS

| | | | |
|---|---|---|---|
| 5,169,488 A | 12/1992 | Giuffre et al. | |
| 5,647,015 A * | 7/1997 | Choate | G06T 7/97 382/103 |
| 6,850,321 B1 * | 2/2005 | Yu | G03F 1/84 356/237.4 |
| 10,110,792 B2 * | 10/2018 | Benson | G06T 7/194 |
| 10,134,560 B2 * | 11/2018 | Ma | H01J 37/18 |
| 2002/0051572 A1 * | 5/2002 | Matsumoto | G06T 7/246 382/190 |
| 2003/0043370 A1 * | 3/2003 | Goldberg | G03F 1/84 356/237.5 |
| 2004/0130691 A1 * | 7/2004 | Boonman | G03F 9/70 355/53 |
| 2004/0151993 A1 * | 8/2004 | Hasegawa | G03F 1/64 430/5 |
| 2005/0037272 A1 * | 2/2005 | Tanaka | H01L 21/67253 430/30 |
| 2005/0213083 A1 * | 9/2005 | Sekine | G01N 21/95607 356/237.1 |
| 2005/0230636 A1 * | 10/2005 | Tanaka | H01J 37/20 250/440.11 |
| 2009/0012743 A1 * | 1/2009 | McDonnell | G01B 9/02057 702/167 |
| 2010/0149505 A1 * | 6/2010 | Sewell | G03B 27/54 355/67 |
| 2012/0099089 A1 * | 4/2012 | Sogard | G03F 1/84 355/52 |
| 2012/0287424 A1 * | 11/2012 | Hori | G01N 21/956 356/237.1 |
| 2013/0082174 A1 * | 4/2013 | Chen | G06T 7/0006 250/307 |
| 2014/0347644 A1 * | 11/2014 | Wu | G03F 9/7026 355/55 |
| 2015/0029499 A1 * | 1/2015 | Wright | G01N 21/956 356/237.5 |
| 2015/0146968 A1 * | 5/2015 | Tien | G06T 7/001 382/149 |
| 2016/0171674 A1 * | 6/2016 | Tsuchiya | G06K 9/036 382/149 |

\* cited by examiner

INSPECTION METHOD OF A PHOTOMASK AND AN INSPECTION SYSTEM

CROSS-REFERENCE TO RELATED APPLICATION

This application claims the priority benefit of U.S. provisional application Ser. No. 62/582,320, filed on Nov. 7, 2017. The entirety of the above-mentioned patent application is hereby incorporated by reference herein and made a part of this specification.

BACKGROUND

Semiconductor manufacturing involves hundreds of processes. A photolithography process, which further includes various procedures such as photoresist coating, baking, photomask alignment, exposing, and developing etc, is one of the most critical processes. As for critical dimension (CD) relevant to the structure of a semiconductor device, the pattern of each thin film, for example, is determined by the photolithography process using a photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
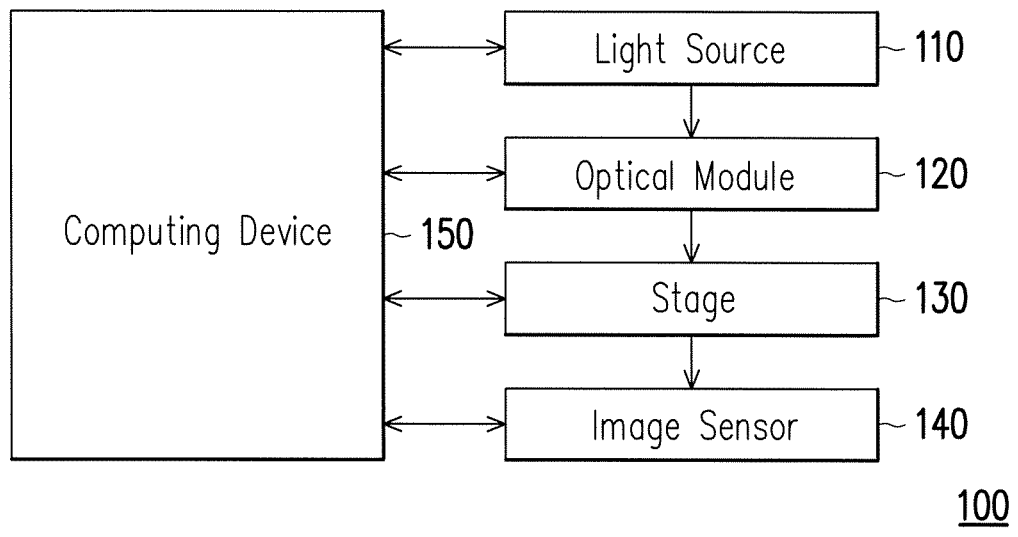
FIG. 1A is a schematic diagram illustrating an inspection system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1A, an inspection system 100 may include a light source 110, an optical module 120, a stage 130, an image sensor 140 and a computing device 150. The light source 110 may be an ultraviolet (UV) light. In various examples, the light source 110 may include a light source selected from the group consisting of UV source, deep UV (DUV) source, extreme UV (EUV) source, and X-ray source. The optical module 120 is configured to adjust and control the light emitted from the light source 110 so that the illuminated light subjected to the optical module 120 is able to irradiate to the stage 130 and the workpiece such as a photomask loaded thereon and image the workpiece on the image sensor 140. The image of the workpiece loaded on the stage 130 may be captured by the image sensor 140. The image sensor 140 may include a charge coupled device (CCD). The computing device 150 may communicate with the light source 110, the optical module 120, the stage 130 and the image sensor 140 and include a plurality of circuits to control and adjust the stage 130, the light source 110 and the optical module 120, store the image captured by the image sensor 140 and compare the captured image with a reference image or another captured image to determine whether a defect is generated. In some embodiments, the inspection process using the inspection system 100 may be performed more than once during and/or after the fabrication of the workpiece such as a photomask.

Figure 1B:
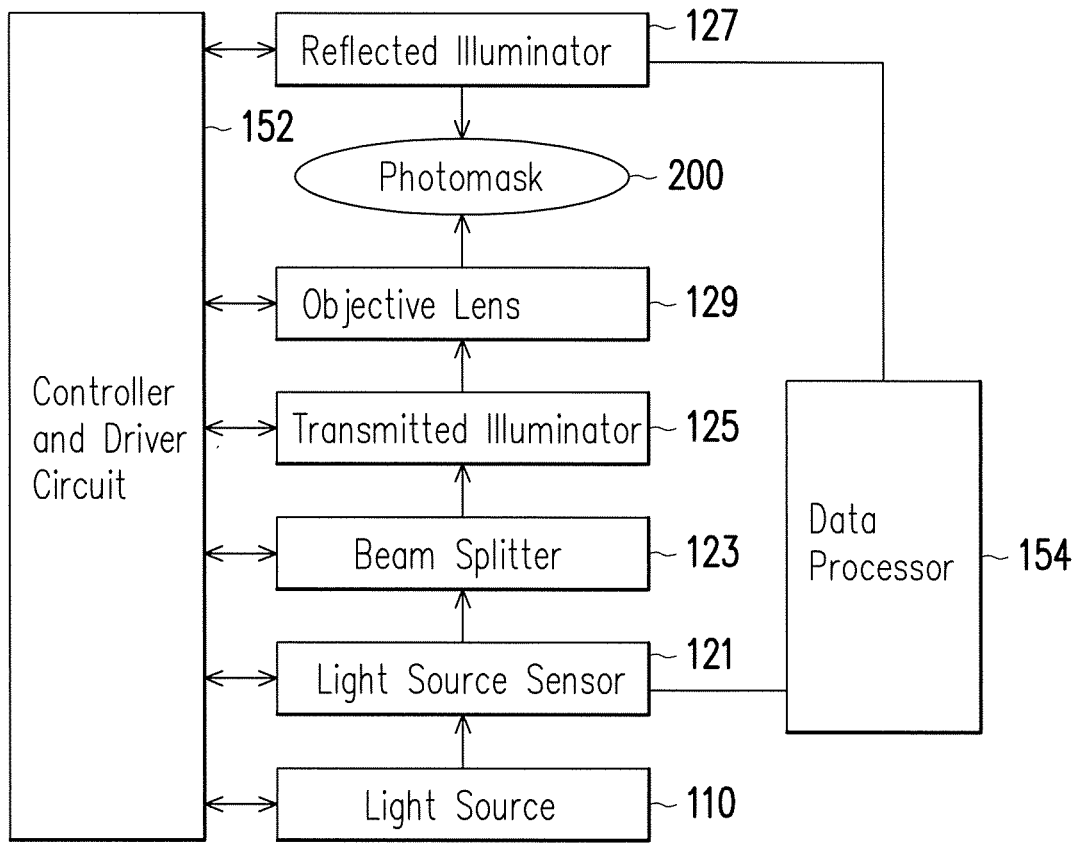
FIG. 1B is a schematic diagram illustrating an optical module and a computing device of an inspection system in accordance with some embodiments.

As shown in FIG. 1A and FIG. 1B, the optical module 120 may include a light source sensor 121, a beam splitter 123, a transmitted illuminator 125, a reflected illuminator 127, and an objective lens 129. The light source sensor 121 may be a time delay integration sensor capable of sensing the light emitted from the light source 110. The beam splitter 123 may be located at the downstream of the light source 110 to split the light emitted from the light source 110, such that the light being split is able to irradiate toward the transmitted illuminator 125 and the reflected illuminator 127, respectively. The transmitted illuminator 125 may include a tube lens, a lens assembly including multiple of lenses, an image field plate capable of controlling the outline of the image field, a zoom lens, etc. The reflected illuminator 127 may include a condenser lens, a mirror, a zoom lens, etc. The light passing through the transmitted illuminator 125 and the light subjected to the optical effect of the reflected illuminator 127 further irradiate to the workpiece such as a photomask 200 loaded on the stage 130 shown in FIG. 1A, and forms the image of the photomask 200 on the image sensor 140 through the objective lens 129. The objective lens 129 may be a zoom lens so that the focal length and the angle of view thereof can be varied without moving the position of the objective lens 129. In other words, the objective lens 129 maintains focus when its focal length changes.

As shown in FIG. 1B, the computing device 150 may include a controller and driver circuit 152 and a data processor 154. The controller and driver circuit 152 may be configured to control and drive the light source sensor 121, the beam splitter 123, the transmitted illuminator 125, the reflected illuminator 127 and the objective lens 129. For example, the focus of the objective lens 129 may be adjusted based on the signal or instruction from the controller and driver circuit 152. The data processor 154 may process the data from any of the light source sensor 121, the beam splitter 123, the transmitted illuminator 125, the reflected illuminator 127 and the objective lens 129 and also process the data regarding the image captured by the image sensor 140 so as to generate the information regarding these data for the subsequent process. In some embodiments, the data processor 154 may include an integrated circuit capable of comparing and calculating the data and a memory capable of storing the data and the result of the data processing. In some alternative embodiments, the computing device 150 may further include a memory to store the data generated during the operation of the inspection system 100 and/or store the default data that is required for the operation of the inspection system 100.

Figure 2:
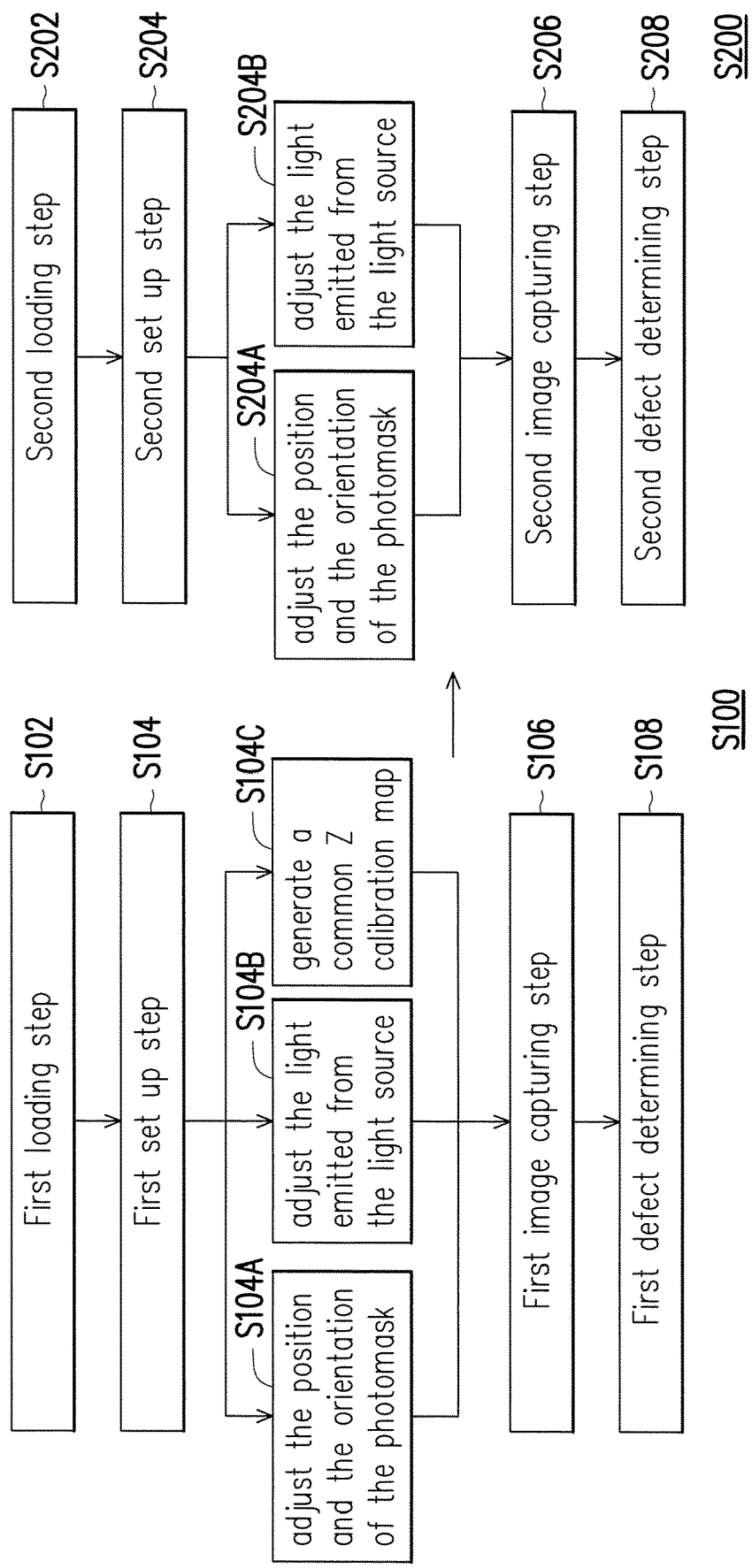
FIG. 2 is a flowchart illustrating an inspection method of photomask in accordance of some embodiments.

The photomask may be fabricated by a plurality of fabrication steps. To ensure the quality of the photomask, the inspection method as shown in FIG. 2 may be performed. The inspection method of a photomask may include performing a first inspection process S100 and a second inspection process S200 by the inspection system 100. In some embodiments, the first inspection process S100 is performed after a selected fabrication step of the photomask, a subsequent fabrication step is performed after the first inspection process S100 and the second inspection process S200 is performed after the subsequent fabrication step. In other words, the photomask may be unloaded and reloaded to the inspection system 100 between the first inspection process S100 and the second inspection process S200.

Specifically, referring to FIG. 1A, FIG. 1B and FIG. 2, in the first inspection process S100, a first loading step S102 may be performed to load the photomask 200 on the stage 130 of the inspection system 100. After the photomask 200 is loaded, a first set up step S104 is performed to adjust the position and the orientation of the photomask 200 (step S104A), adjust and calibrate the light emitted from a light source 110 (step S104B), and generate a common Z calibration map (step S104C) of the objective lens 129 of the optical module 120. During the first set up step S104, the controller and driver circuit 152 may provide the signal or the instruction to adjust the stage 130, the light source 110 and the optical module 120 to a proper status. Thereafter, a first image capturing step S106 is performed by using the image sensor 140 to capture the first image of the photomask 200 while the illuminated light emitted from the light source 110 scans the photomask through the optical module 120 by automatically focusing the objective lens 129 based on the common Z calibration map. After obtaining the first image of the photomask, a first defect determining step S108 may be performed to determine whether a defect exists by the data processor 154.

In some embodiments, the defect may be further analyzed and categorized by the data processor 154 if a defect is determined in the first inspection method. For example, the defect capable of being removed by performing a cleaning step is categorized as a hard defect and the defect that is not possible to be removed is categorized as a soft defect. In some instances, the hard defect may include an unwanted dummy pattern on the photomask, an unwanted pattern blank such as a pinhole or a pindot or the like. The soft defect may include a change on the global CD (critical dimension) uniformity, a miss-sizing, a misplacement, or the like. According to the categorization of the defect, a corresponding repair step may be performed to eliminate the defect or the tool of performing the fabrication step prior to the inspection process is checked.

Figure 3:
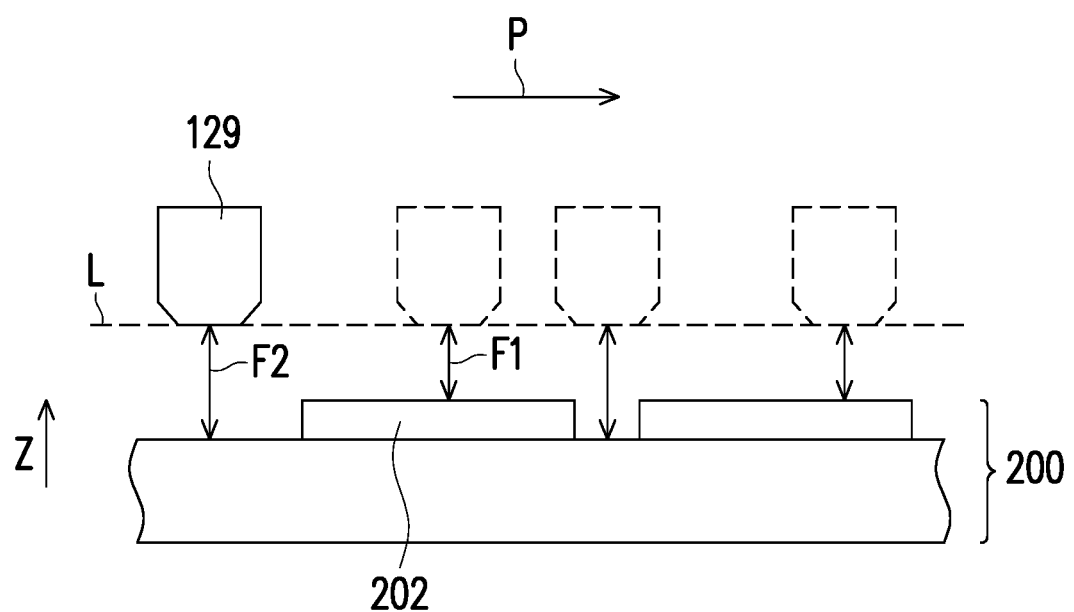
FIG. 3 is a schematic diagram illustrating the step of generating a Z calibration map in accordance with some embodiments.

FIG. 3 schematically illustrates the step of generating a Z calibration map. Referring to FIG. 1A, FIG. 1B and FIG. 3, the photomask 200 may be scanned along the scanning path P by the optical module 120. During the scanning, the position of the photomask 200 relative to the objective lens 129 of the optical module 120 may be shifted along the scanning path P so that various points of the photomask 200 along the scanning path P may be alternately located within the photographing area of the objective lens 129 of the optical module 120 while the objective lens 129 of the optical module 120 remains at a common level L in the Z direction. In some embodiments, the physical position of the objective lens 129 may remain unchanged during the scanning and the stage 130 carrying the photomask 200 may be able to move so that the relative position of the photomask and the objective lens 129 may be shifted along the scanning path P.

As shown in FIG. 3, the pattern 202 on the photomask 200 is a relative protruding structure such that the distance F1 between the objective lens 129 and the objective surface at the point having the pattern 202 and the distance F2 between the objective lens 129 and the objective surface at the point without the pattern 202 may be different. Accordingly, during the step of scanning shown in FIG. 3, the computing device 150 of the inspection system 100 may determine and record the best focus of the objective lens 129 at respective points on the scanning path P to generate the Z calibration map 300 as shown in FIG. 4.

Figure 4:
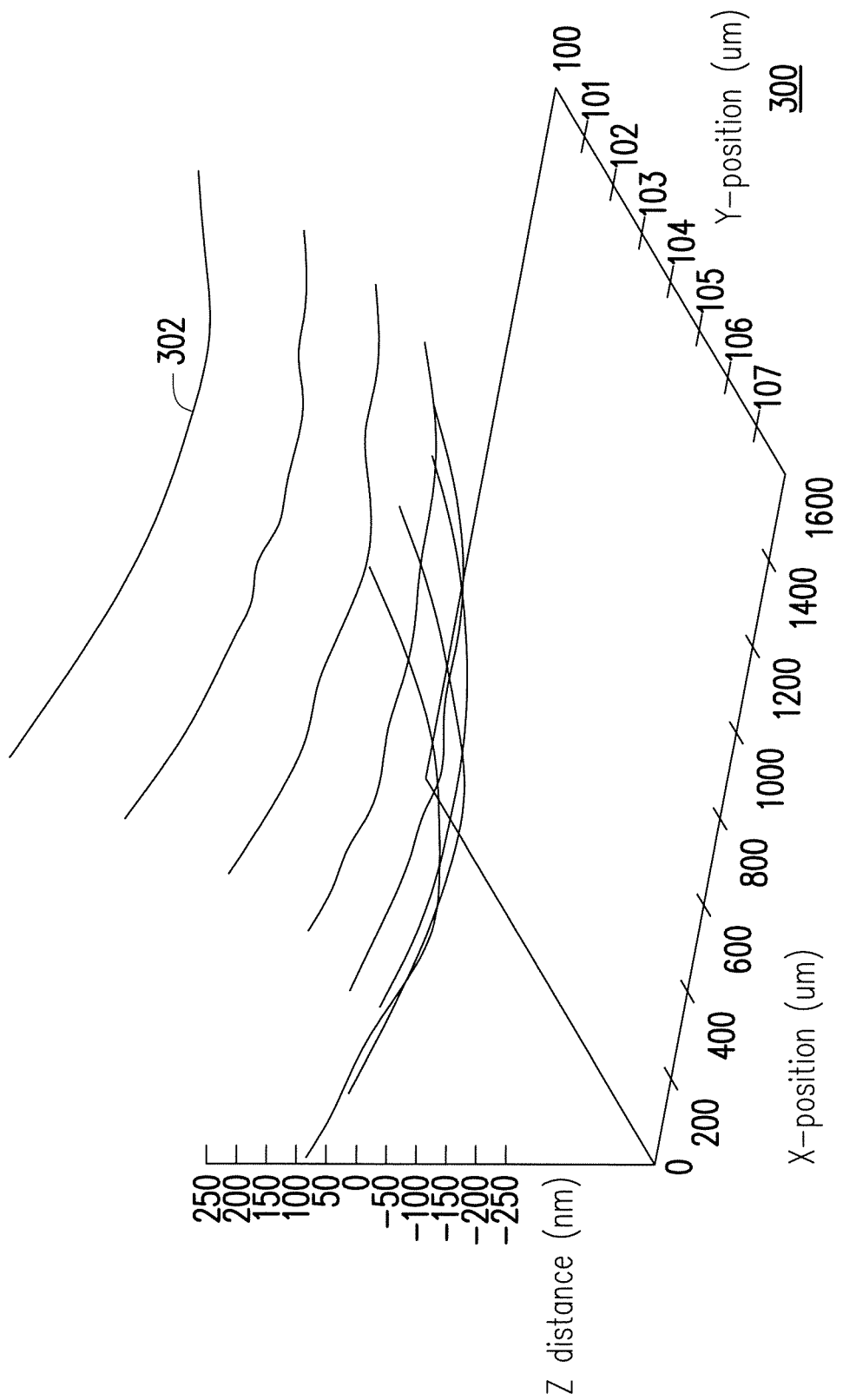
FIG. 4 is a schematic diagram illustrating a Z calibration map in accordance with some embodiments.

The Z calibration map 300 as shown in FIG. 4 includes a plurality of Z calibration curves 302 extending along respective scanning paths P and each Z calibration curve 302 may include the information of the Z distance at respective points on one scanning path P mapping on the coordination system represented by the X-position and the Y-position. The generated Z calibration map 300 may be stored in the computing device 150 of the inspection system 100.

The Z calibration map 300 is used in the first image capturing step S106. In the first image capturing step S106, the illuminated light emitted from the light source 110 may scan the photomask 200 along the scanning path P through the optical module 120 by auto-focusing the objective lens 129 of the optical module 120 based on the Z calibration map 300 and the image sensor 140 of the inspection system 100 captures the first image of the photomask 200 simultaneously. Owing that the Z calibration map 300 stored in the computing device 150 includes the best focus information of the objective lens 129 of the optical module 120 at the respective points of the scanning paths, the first image may have sufficient quality to reflect the real structure of the photomask 200 so that the following first defect determining step S108 may accurately determine whether a defect exists.

After the first inspection process S100, the photomask 200 may be unloaded from the inspection system 100 to be treated by a subsequent fabrication step and the photomask 200 treated by the subsequent fabrication step may be further inspected by performing the second inspection process S200. The computing device 150 may share the Z calibration map 300 generated in the first inspection process S100 into the second inspection process S200 so that the Z calibration map 300 generated in the first inspection process S100 may be considered as a common Z calibration map shared by various inspection processes.

In the second inspection process S200, as shown in FIG. 1A, FIG. 1B and FIG. 2, a second loading step S202 may be performed to load the photomask 200 on the stage 130 of the inspection system 100. After the photomask 200 is loaded, a second set up step S204 is performed to adjust the position and the orientation of the photomask 200 (step S204A), and adjust the illuminated light emitted from the light source 110 of the inspection system 100 (S204B). Thereafter, a second image capturing step S206 is performed by using the image sensor 140 to capture the second image of the photomask 200 while the illuminated light scans the photomask 200 through the optical module 120 of the inspection system 100 by automatically focusing the objective lens 129 of the optical module 120 based on the Z calibration map 300 generated in the first inspection process S100. After obtaining the second image of the photomask 200, a second defect determining step S208 may be performed to determine whether a defect exists.

In some embodiments, the second defect determining step S208 may include comparing the second image to a reference image, wherein the reference image may be a default image of the photomask 200 that is already stored in the computing device 150 or the first image captured in the first inspection process S100. In some further embodiments, the second inspection process S200 may be performed more than once, and the reference image may be the second image captured in the previous second inspection process S200. Compared to the first inspection process S100, the step of generating the Z calibration map is omitted in the second set up step S204 of the second inspection process S200. Accordingly, the second inspection process S200 may save time to improve the efficiency of the inspection of the photomask.

Figure 5:
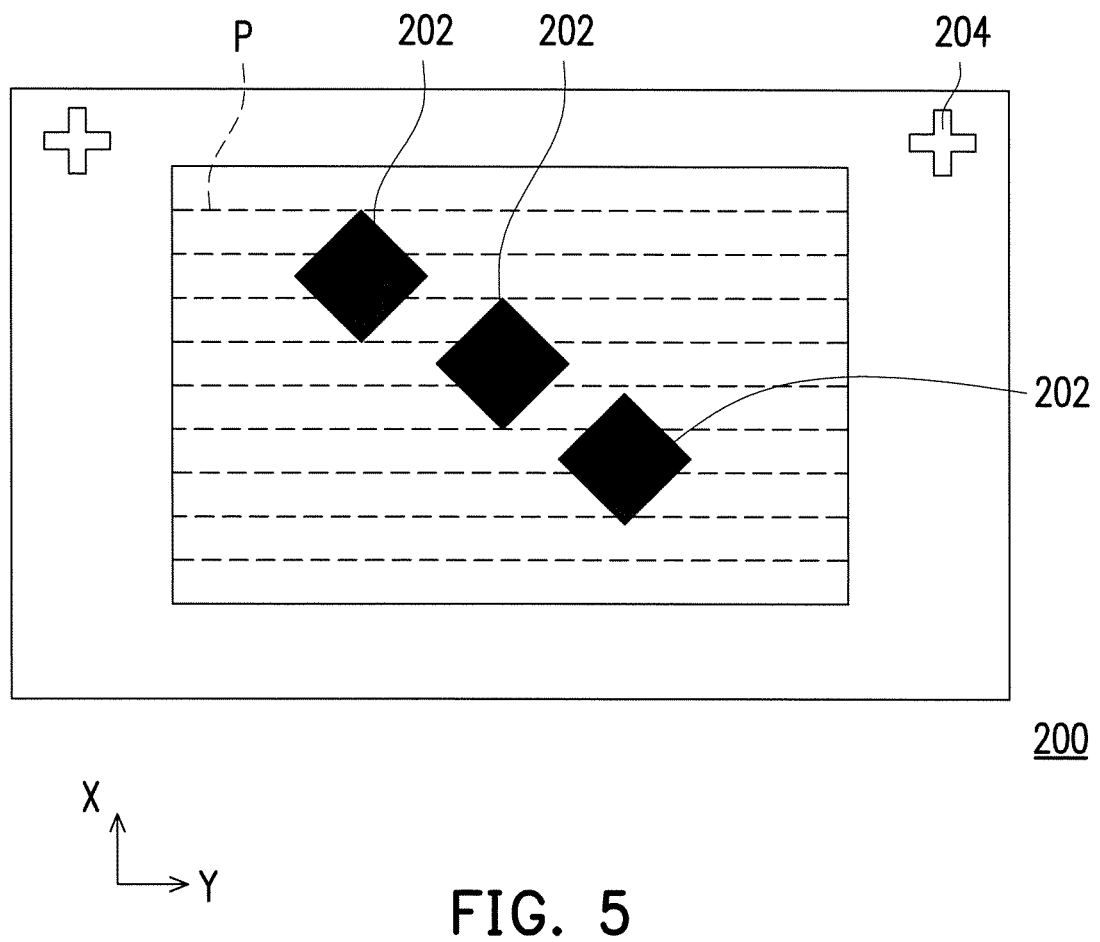
FIG. 5 is a schematic diagram illustrating a top view of a photomask in accordance with some embodiments.

In some embodiments, as shown in FIG. 5, a photomask 200 has at least one pattern 202 and an alignment mark 204 in the top view. Referring to FIG. 5 and FIG. 2, for inspecting the photomask 200, the photomask 200 may be loaded on the stage of the inspection system in the first loading step S102 or the second loading step S202. Subsequently, the photomask 200 loaded on the stage may be positioned in a predetermined orientation and position by using the alignment mark 204 as an alignment reference in the step S104A of the first set up step S104 or the step S204A of the second set up step S204. The coordination system of X-Y plane in the Z calibration map 300 shown in FIG. 4 may be defined with respect to the position and the orientation of the photomask 200. In addition, a plurality of virtual paths may be further defined as scanning paths P extending on the X-Y plane across the region where the patterns 202 are located. In the step S104C of the first set up step S104 and the image capturing steps S106 and S206, the optical module 120 may scan the photomask 200 along the scanning paths P that is defined with respect to the position and the orientation of the photomask 200.

Figure 6A:
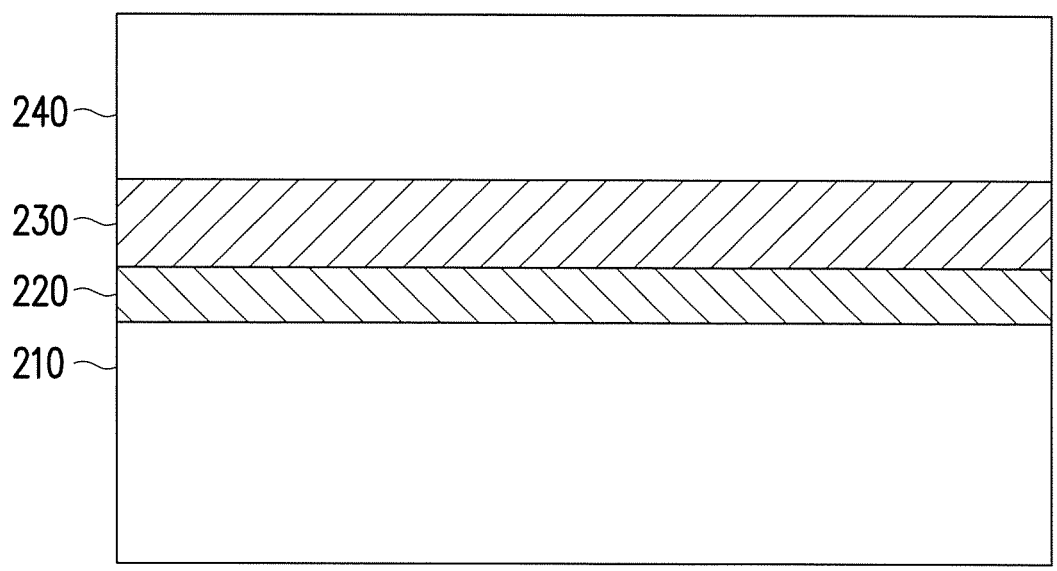
FIG. 6A to 6M are schematic diagrams illustrating the fabrication steps of the fabrication of a photomask in accordance with some embodiments.

In some embodiments, the photomask 200 may be fabricated by performing the following steps. Referring to FIG. 6A, a first material layer 220, a second material layer 230 and a photoresist layer 240 are sequentially formed on the substrate 210. A material of the first material layer 220 may include a phase shift material such as chrome oxide (CrOx), molybdenum silicide or other material capable of changing a phase of light and a thickness of the first material layer 220 may be 40 nm to 100 nm. A material of the second material layer 230 may include metal such as Cr and a thickness of the second material layer 230 may be 5 nm to 80 nm. A material of the photoresist layer 240 may include a photosensitive material and a thickness of the photoresist layer 240 may be 60 nm to 120 nm.

Figure 6B:
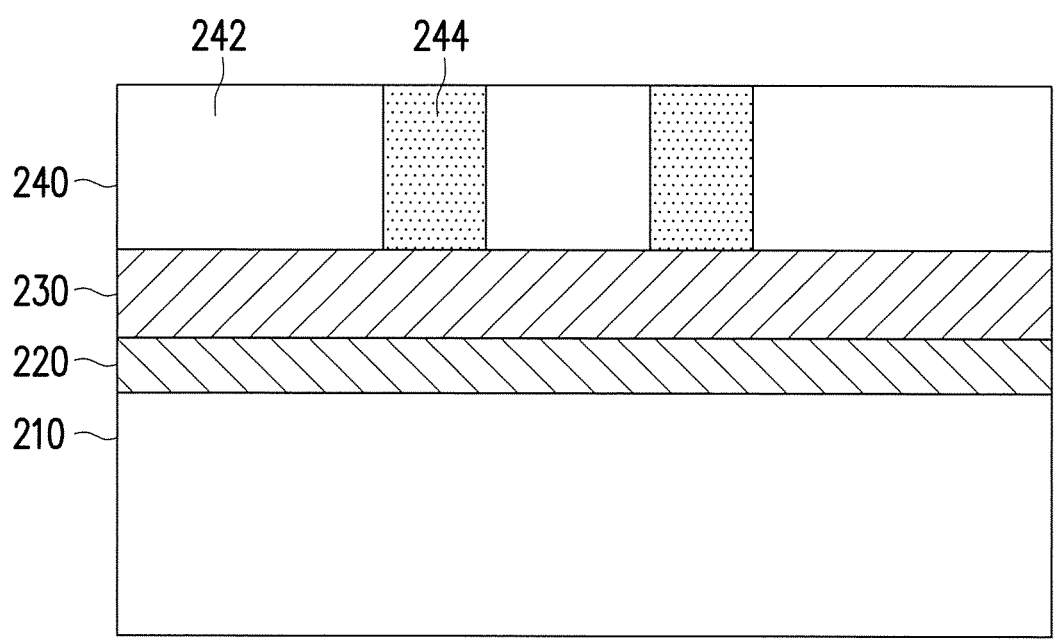
Figure 6C:
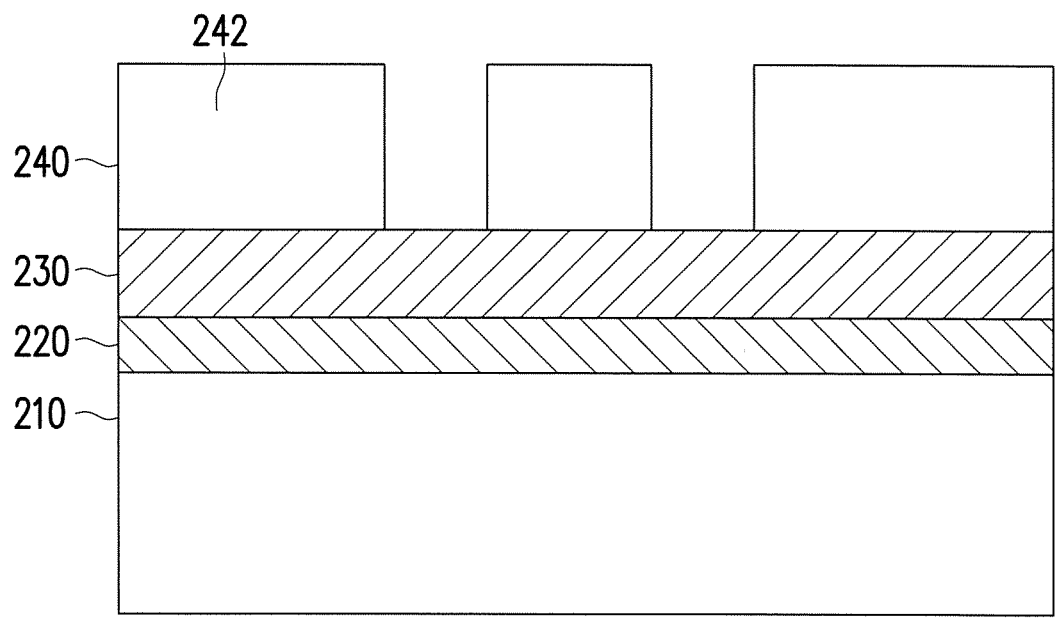
Figure 6D:
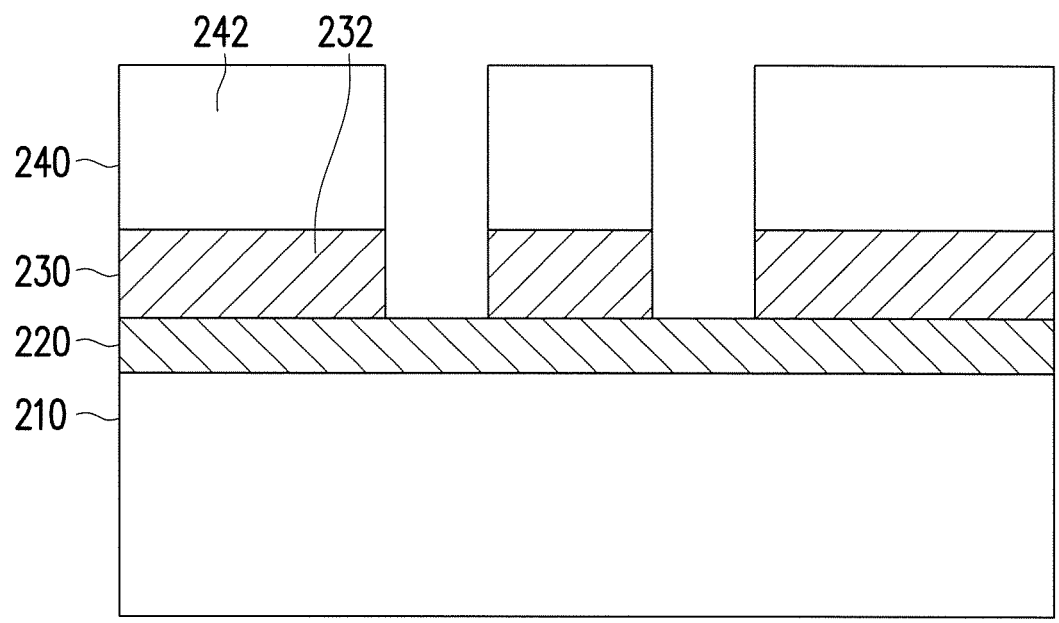

In FIG. 6B, an exposure step may be performed by irradiating light on a portion of the photoresist layer 240 so that the photoresist layer 240 may include a pattern portion 242 and a sacrificial portion 244 having different property from the pattern portion 242 and a prebaking step may be performed after the exposure step to evaporate some of the solution or the volatile material in the photoresist layer 240. In FIG. 6C, a develop step is performed to remove the sacrificial portion 244 to expose a portion of the second material layer 230 while the pattern portion 242 remains on the substrate 210 to cover another portion of the second material layer 230. In FIG. 6D, an etching step, e.g. a dry etching step is performed to remove the exposed portion of the second material layer 230 by using the pattern portion 242 of the photoresist layer 240 as mask, such that the second material layer 230 is patterned to include the pattern portion 232 underlying the pattern portion 242 of the photoresist layer 240. The material of the second material layer 230 may have a sufficient etching selection with respect to the material of the first material layer 220 in the step of FIG. 6D so that the first material layer 220 may not be removed and partially exposed in the step of FIG. 6D.

Figure 6E:
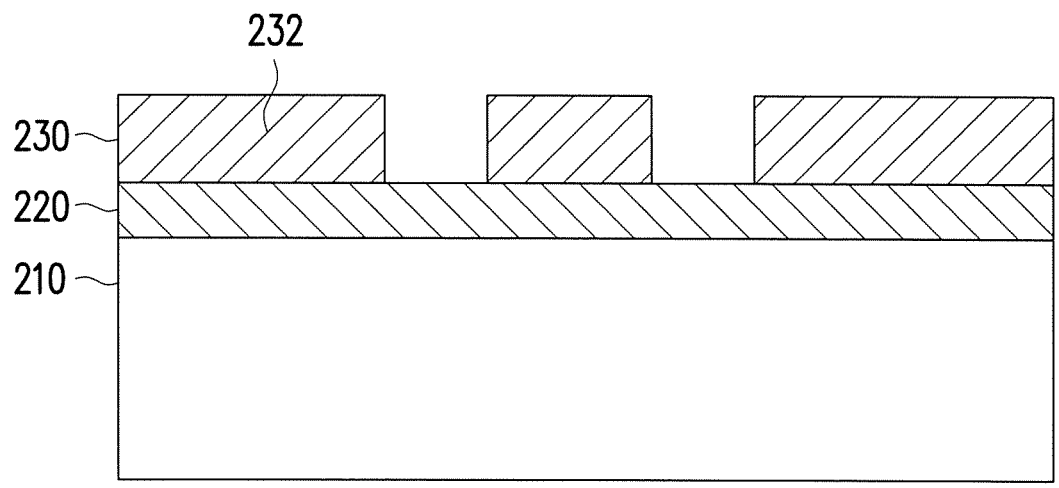

In the following step as shown in FIG. 6E, a stripping step is performed to remove the photoresist layer 240 so that the pattern portion 232 of the second material layer 230 is exposed. In some embodiments, after the stripping steps, a clean step may be performed to remove a possible residue of the photoresist material. Subsequently, as shown in FIG. 6F, another etching step, e.g. another dry etching step is performed to remove a portion of the first material layer 220 by using the pattern portion 232 of the second material layer 230 as mask, such that the first material layer 220 is patterned to include the pattern portion 222 corresponding to the pattern portion 232.

Figure 6F:
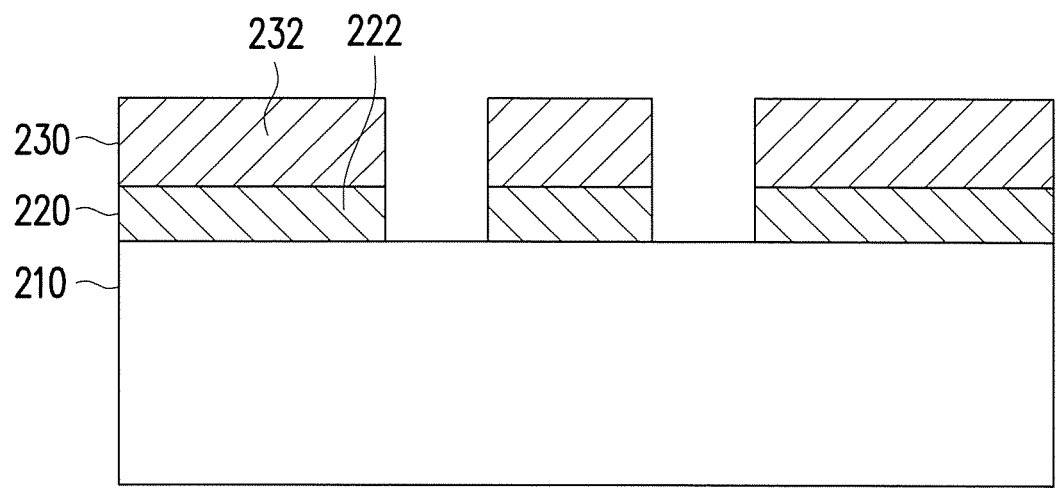
Figure 6G:
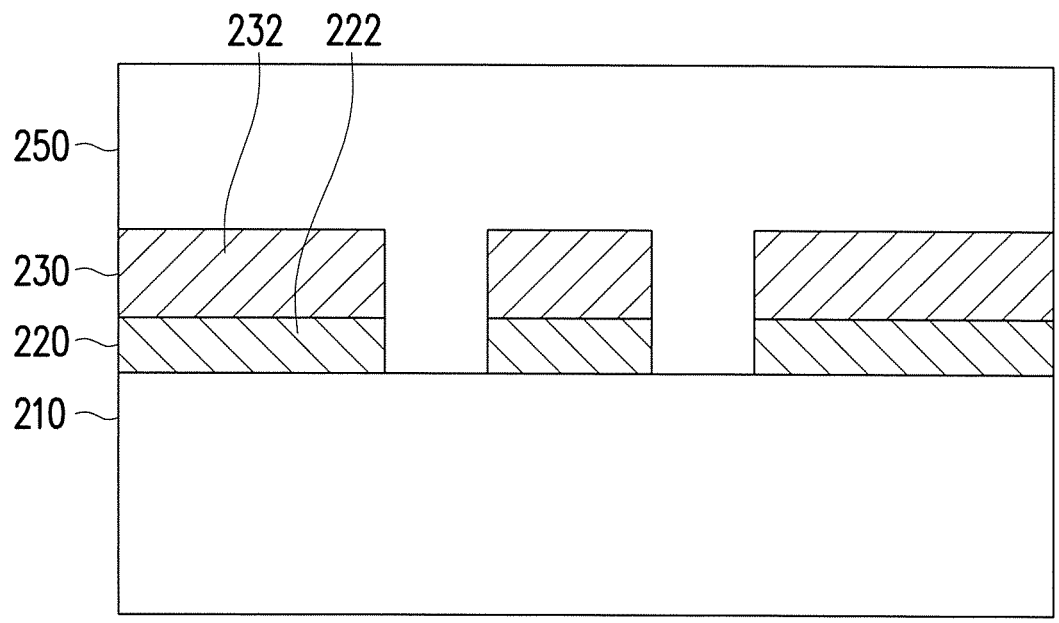
Figure 6H:
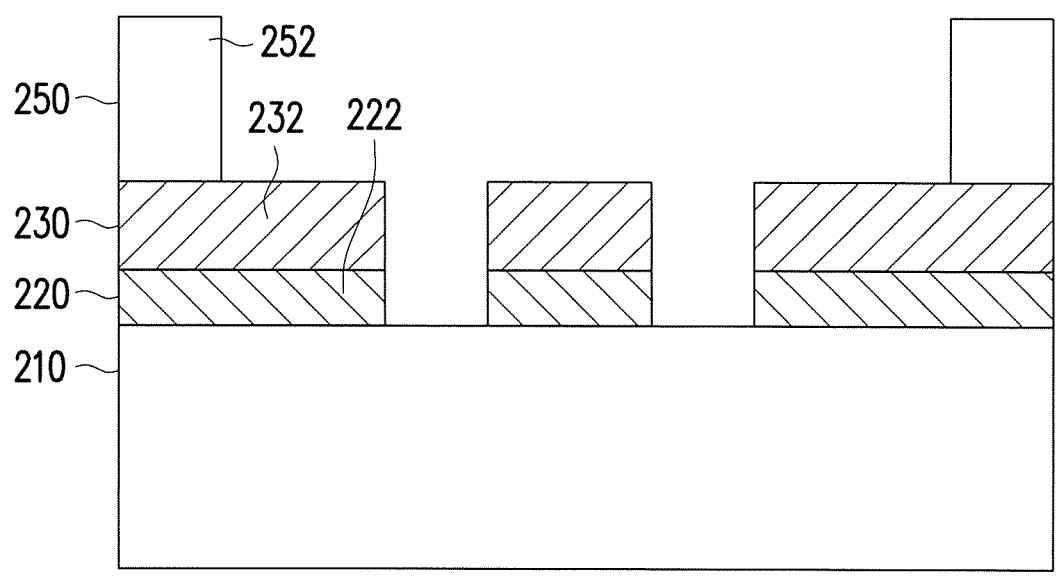
Figure 6I:
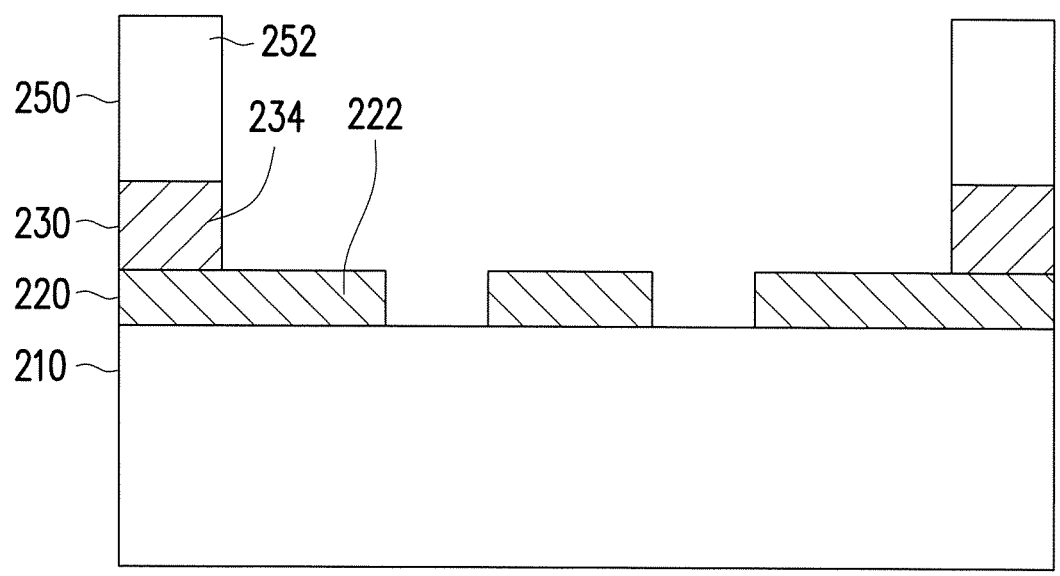
Figure 6J:
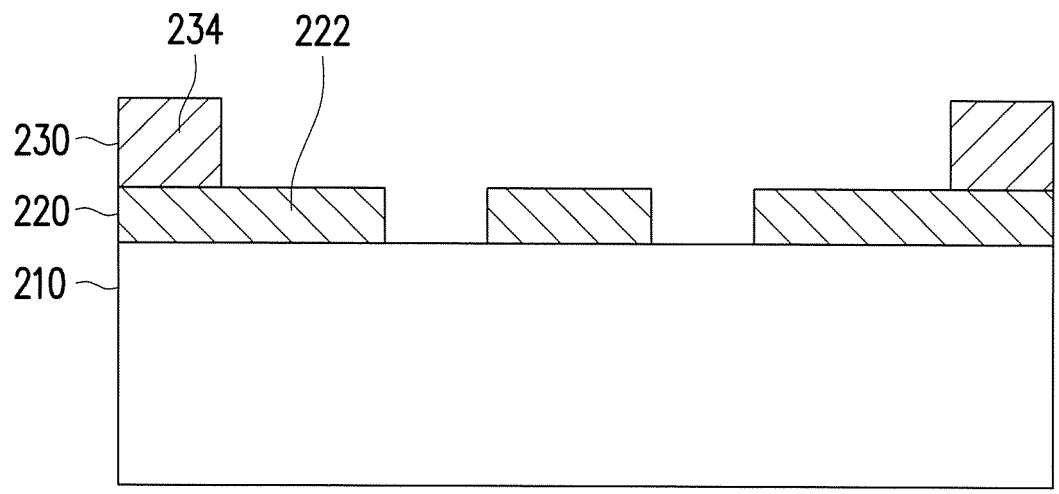
Figure 6K:
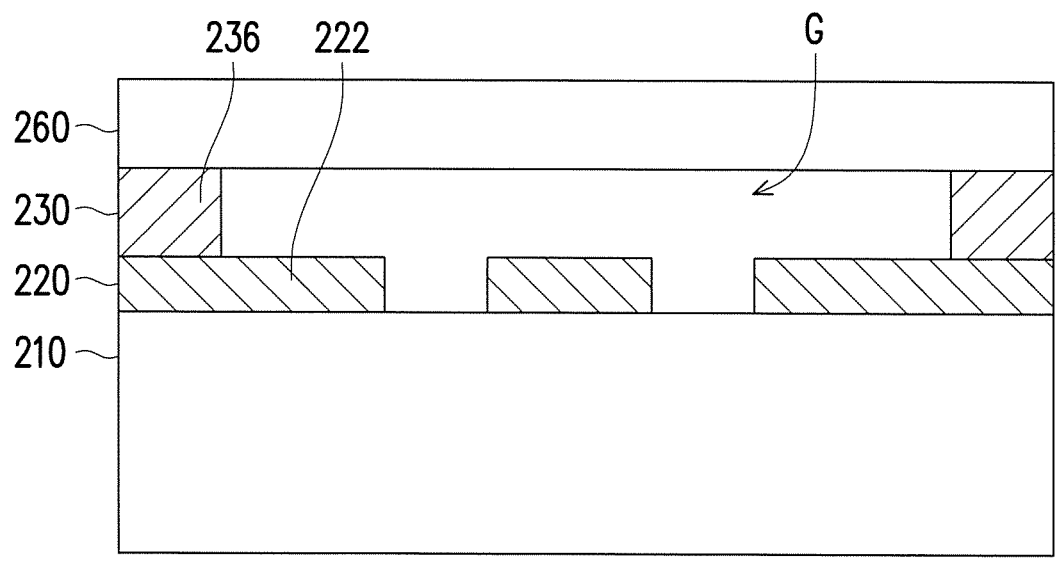

In some embodiments, as shown in FIG. 6G, another photoresist layer 250 is formed on the substrate 210 to cover the structure of the pattern portion 232 stacking on the pattern portion 222. Thereafter, the photoresist layer 250 may be partially exposed by light and developed to have the pattern portion 252 as shown in FIG. 6H. The pattern portion 252 is subsequently used as a mask for etching the second material layer 230 as shown in FIG. 6I, but the etching step of the second material layer 230 may not remove the first material layer 220, so that the second material layer 230 is patterned to include the cushion portion 234 surrounding the periphery of the substrate 210 without removing the first material layer 220. In the following step, the photoresist layer 250 is removed by performing another stripping step or other step capable of removing the photoresist layer 250 without damaging the first material layer 220 and the second material layer 230. Therefore, as shown in FIG. 6J, the pattern portion 222 of the first material layer 220 and the cushion portion 234 of the second material layer 230 stacked sequentially on the substrate 210 are exposed. In some embodiments, after the stripping steps, a clean step may be performed to remove a possible residue of the photoresist material. In FIG. 6K, a pellicle 260 is formed on the cushion portion 236 and an air gap G may exist between the pellicle 260 and the substrate 210. In some embodiments, the pellicle 260 is a transparent film capable of protecting the pattern portion 222 of the first material layer 220 and serving as a dust proofing film.

Figure 6L:
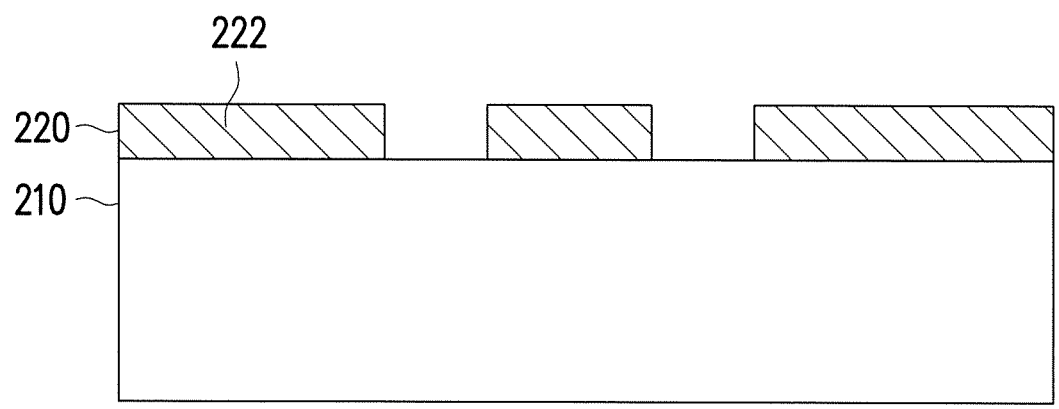

In some alternative embodiments, after the step of FIG. 6F, the second material layer 230 may be removed by performing a stripping step or other step capable of removing the second material layer 230 without damaging the first material layer 220, such that the first material layer 220 having the pattern portion 222 remains on the substrate 210 and is exposed as shown in FIG. 6L. Subsequently, the pellicle 260 is formed on the first material layer 220 so that the pattern portion 222 of the first material layer 220 is sandwiched between the substrate 210 and the pellicle 260 as shown in FIG. 6M.

In some embodiments, the photomask 200 shown in FIG. 5 may be fabricated by performing the steps of FIG. 6A to FIG. 6F followed by the steps of FIG. 6G to FIG. 6K. The inspection method of the photomask 200 may include performing the first inspection process S100 in FIG. 2 after the step of FIG. 6J and performing the second inspection process S200 in FIG. 2 after the step of FIG. 6K. After the step of FIG. 6J, the photomask 200 may have the pattern portion 222 on the substrate 210. The first inspection process S100 may be performed to check whether a defect is generated in the fabrication steps of FIG. 6A to FIG. 6J. After the first inspection process S100, the photomask is unloaded from the inspection system. The photomask may be repaired if a defect is determined in the first inspection process S100 and the step of FIG. 6K is subsequently performed to form the pellicle 260 as shown in FIG. 6K. Alternately, if no defect is found in the first inspection process S100, the step of FIG. 6K is performed right after the photomask being unloaded from the inspection system.

After forming the pellicle 260 as shown in FIG. 6K, the second inspection process S200 is performed to further check the quality of the finished photomask 200. In the embodiment, the second inspection process S200 may omit the step of generating the Z calibration map shown in FIG. 3, and during the second image capturing step S206, the objective lens 129 in the optical module 120 of the inspection system 200 is automatically focused based on the Z calibration map 300 that is generated in the first inspection process S100. Accordingly, the second inspection process S200 may take less time than the first inspection process S100 so as to improve the efficiency of the fabrication.

Figure 6M:
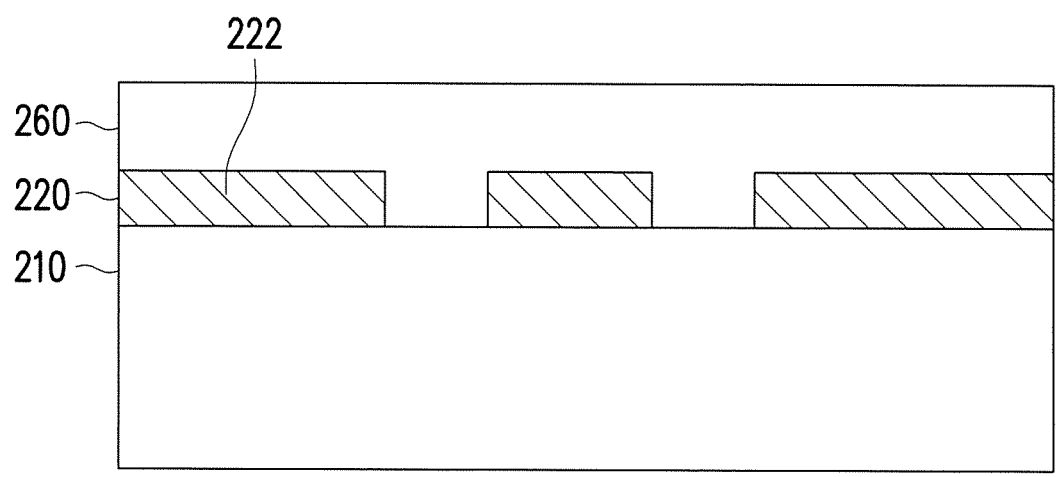

In some alternative embodiments, the photomask 200 shown in FIG. 5 may be fabricated by performing the steps of FIG. 6A to FIG. 6F followed by the steps of FIG. 6L to FIG. 6M. The inspection method of the photomask 200 may include performing the first inspection process S100 in FIG. 2 after the step of FIG. 6L and performing the second inspection process S200 in FIG. 2 after the step of FIG. 6M. The Z calibration map generated in the first inspection process S100 is utilized and shared in the second inspection process S200 so that the time for inspecting the photomask 200 may be saved.

Figure 7:
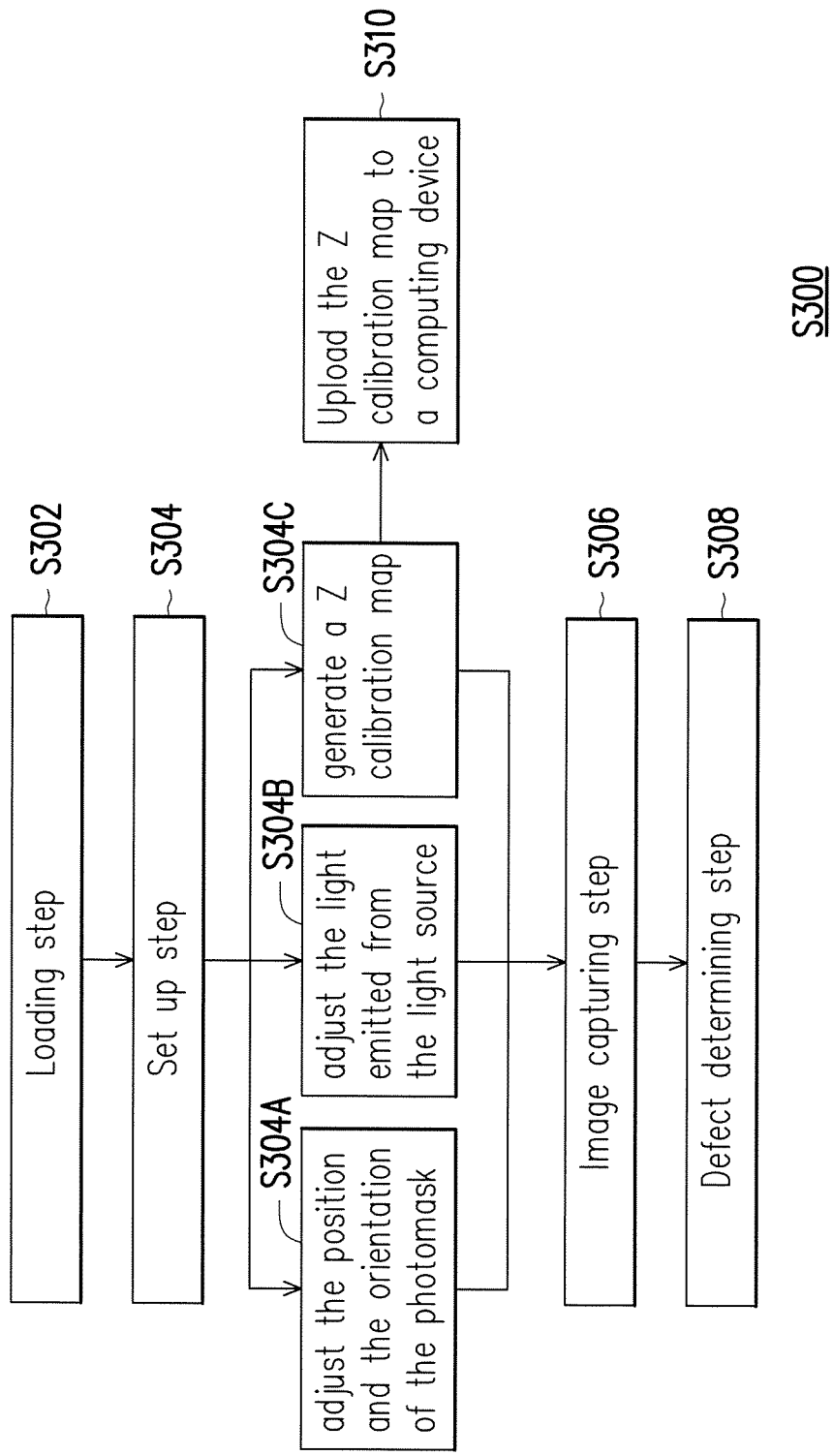
FIG. 7 is a flowchart illustrating an inspection method of photomask in accordance of some embodiments.

In some alternative embodiments, the inspection method shown in FIG. 7 may be performed after each of the steps of FIGS. 6C to 6M. The inspection method S300 as shown in FIG. 7 may include a loading step S302, a set up step S304, an image capturing step S306 and a defect determining step S308 and may be performed by using the inspection system shown in FIG. 1A. The photomask is loaded onto the stage of the inspection system in the loading step S302. The set up step S304 may include adjusting the position and the orientation of the photomask (step S304A), adjusting and calibrating the light emitted from the light source (step S304B), and generating a Z calibration map (step S304C) of the objective lens of the optical module with respect to the photomask. The image capturing step S306 may be performed by using the image sensor to capture the first image of the photomask while the illuminated light scans the photomask through the optical module by automatically focusing the objective lens based on the Z calibration map generated in the step S304C. Thereafter, a defect determining step S308 may be performed to determine whether a defect exists by comparing the captured image with a reference image. In addition, after the step S304C, the generated Z calibration map may be uploaded to a computing device (S310) to check whether the respective fabrication steps are performed normally based on the generated Z calibration map.

In some embodiments, the inspection method S300 may be repeated several times between the fabrication steps of the photomask. Therefore, the Z calibration map obtained in each inspection method S300 may be compared with another Z calibration map obtained in a previous inspection method S300. A fluctuation of the Z calibration map or one or more extraordinary peak in the Z calibration map relative to the reference Z calibration map determined by the comparison may be considered as abnormal information of the Z calibration map. Once the abnormal information is determined, the tool of the respective fabrication steps may be checked and adjusted/repaired to reduce the possibility of a defect.

For example, in the inspection method S300 performed after the step of FIG. 6C (the exposure step), the Z calibration map generated in the step S304C may be compared with a reference Z calibration map that is already stored in the computing device. If the fluctuation of the generated Z calibration map is determined, this may be caused by abnormal exposure energy and the light source of the exposure tool may be checked and adjusted. If one or more extraordinary peak in the generated Z calibration map is determined, the exposure tool may be checked whether a contamination exists.

In the inspection method S300 performed after the step of FIG. 6D or FIG. 6F (the etching step), the generated Z calibration map may be compared with a reference Z calibration map that is already stored in the computing device. If the fluctuation of the Z calibration map is determined, this may cause by incomplete or over etching and the etching tool may be checked whether the etching gas or the etching plasma is normal. If one or more extraordinary peak in the generated Z calibration map is determined, the etching tool may be checked whether a contamination exists. In the inspection method S300 performed after the step of FIG. 6E or FIG. 6J (photoresist layer stripping step), the generated Z calibration map may be compared with a reference Z calibration map that is already stored in the computing device. If the fluctuation of the generated Z calibration map is determined, this may be caused by incomplete stripping and the stripping tool may be checked whether the stripping agent is proper. If one or more extraordinary peak in the generated Z calibration map is determined, the stripping tool may be checked whether a contamination exists.

In addition, the inspection processes S300 for the same photomask may be repeated so that the status of the inspection system may be checked by comparing the Z calibration maps generated in different inspection processes S300. If the generated Z calibration map is shifted in the Z direction with respective to a reference one, the optical module of the inspection system may be checked. If the height of the generated Z calibration map is tilted with respective to a reference one, the stage of the inspection system may be checked. If the data of the generated Z calibration map is not complete with respect to the reference one, the stage of the inspection system or the algorithm stored in the computing device may be checked. By comparing the Z calibration map with a reference one after each fabrication step and/or each inspection process, the tools for the respective fabrication steps and the inspection system may be checked in time to ensure the fabrication yield of the photomask.

In some embodiments, the inspection method S300 may be performed by using different inspection systems and the Z calibration maps generated by using different inspection systems may be shared to each other. In some embodiments, the same photomask may be inspected in a first inspection system by using the inspection method S300 to obtain a first Z calibration map and further inspected in a second inspection system by using the inspection method S300 to obtain a second Z calibration map. The first Z calibration map may be stored in the first inspection system and shared to the second inspection system. The first Z calibration map and the second Z calibration map may be compared by the computing device of the second inspection system. Alternately, the second Z calibration map may be stored in the second inspection system and shared to the first inspection system and the first Z calibration map and the second Z calibration map may be compared by the computing device of the first inspection system. If a variation between the first Z calibration map and the second Z calibration map is determined, a compensation data may be generated and used as a calibration data for inter-apparatuses inspections.

In the case a variation between the first Z calibration map generate in the first inspection system and the second Z calibration map generated in the second inspection system is determined and a compensation data is generated, the photomask may be inspected by performing the first inspection process S100 in FIG. 2 using the first inspection system and performing the second inspection process S200 using the second inspection system. During the second image capturing step S206 in the second inspection process S200, the objective lens of the second inspection system may be focused based on the Z calibration map generated in the first inspection system along with a calibration using the compensation data.

In the case no variation is found between the first Z calibration map generated in the first inspection system and the second Z calibration map in the second inspection system or the variation between the first Z calibration map and the second Z calibration map is small enough to be neglect, the photomask may be inspected by performing the first inspection process S100 in FIG. 2 using the first apparatus and performing the second inspection process S200 using the second apparatus, wherein the objective lens in the second inspection system may be focused based on the Z calibration map generated in the first inspection system without being calibrating using a compensation data. In other words, the first inspection process S100 and the second inspection process S200 shown in FIG. 2 may be performed using different inspection systems and a corresponding compensation data if generated may be used to compensate the variation between different inspection apparatuses.

In accordance with some embodiments of the present disclosure, an inspection method of a photomask including performing a first inspection process, unloading the photomask from the stage of the inspection system, and performing a second inspection process. In the first inspection process, the photomask is loaded on a stage of an inspection system of the first inspection process, a common Z calibration map of an objective lens of an optical module of the inspection system of the first inspection process with respect to the photomask is generated and stored, and a first image of the photomask is captured by using an image sensor of the inspection system of the first inspection process while an illuminated light emitted from a light source of the inspection system of the first inspection process scans the photomask by focusing the objective lens of the optical module of the inspection system of the first inspection process based on the common Z calibration map. In the second inspection process, the photomask is loaded on a stage of an inspection system of the second inspection process, a second image of the photomask is captured by using an image sensor of the inspection system of the second inspection process while an illuminated light emitted from a light source of the inspection system of the second inspection process scans the photomask by focusing an objective lens of an optical module of the inspection system of the second inspection process based on the common Z calibration map generated in the first inspection process. The first image of the photo mask may be compared with a reference image. The second image of the photo mask may be compared with a reference image, wherein the first image may be the reference image. The common Z calibration map is generated by scanning the photomask along a plurality of scanning paths using the optical module while the objective lens of the optical module is maintained in a common level and determining focus of the objective lens at respective points on the scanning paths. A position and an orientation of the photomask on the stage may be adjusted by using an alignment mark on the photomask after loading the photomask on the stage of the inspection system of the first inspection process and after loading the photomask on the stage of the inspection system of the second inspection process. The illuminated light emitted from the light source of the inspection system of the first inspection process is adjusted and calibrated before generating the common Z calibration map. The illuminated light emitted from a light source of the inspection system of the second inspection process is adjusted and calibrated before capturing the second image of the photomask. The first inspection process and the second inspection process may be performed using different inspection systems. The first inspection process and the second inspection process may be performed using the same inspection system.

In accordance with some embodiments of the present disclosure, an inspection method of a photomask includes loading the photomask on a stage of an inspection system, generating a Z calibration map of an objective lens of an optical module of the inspection system with respect to the photomask, storing the Z calibration map in the inspection system, unloading the photomask from the inspection system, generating another Z calibration map by repeating the uploading and the generating, and comparing the Z calibration map with the another Z calibration map. A fabrication step on the photomask is further performed after unloading the photomask from the inspection system and a tool of performing the fabrication step may be checked based on a result of comparing of the Z calibration map with the another Z calibration map. The fabrication step may include an exposure step, an etching step, or a stripping step. The Z calibration map and another Z calibration map are generated in different inspection systems and the Z calibration map is shared to the different inspection systems. A compensation data may be generated based on a result of comparing the Z calibration map with another Z calibration map. A position and an orientation of the photomask on the stage may be adjusted by using an alignment mark on the photomask after loading the photomask on the inspection system. An illuminated light emitted from a light source of the inspection system may be further adjusted and calibrated after loading the photomask on the stage of the inspection system. An image of the photomask may be captured by using an image sensor of the inspection system while an illuminated light scans the photomask by focusing the objective lens of the optical module of the inspection system based on the Z calibration map.

In accordance with some embodiments of the present disclosure, an inspection system may include a stage, a light source, an optical module, an image sensor, and a computing device. The stage is configured to carry a photomask. The light source is configured to emit a light. The optical module may be located at a downstream of the light source and includes an objective lens proximate to the photomask. The computing device may be communicated with the optical module and configured to drive the optical module, generate a common Z calibration map of the objective lens with respect to the photomask by scanning the photomask through the optical module, store the common Z calibration map, and share the common Z calibration map into various inspection processes. The objective lens may be a zoom lens.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inspection method of a photomask, comprising:
   performing a first inspection process, the first inspection process comprising:
      loading the photomask on a stage of a first inspection system; and
      generating and storing a common Z calibration map of a focus of an objective lens of an optical module with respect to the photomask by scanning the photomask using an optical module of the first inspection system; and
      capturing a first image of the photomask by focusing an objective lens of the optical module of the first inspection system based on the common Z calibration map;
   unloading the photomask from the stage of the first inspection system; and
   performing a second inspection process, the second inspection process comprising:
      loading the photomask on a stage of a second inspection system; and
      capturing a second image of the photomask by focusing an objective lens of an optical module of the second inspection system based on the common Z calibration map generated in the first inspection system.

2. The inspection method of the photomask as claimed in claim 1, further comparing the first image of the photomask with a reference image.

3. The inspection method of the photomask as claimed in claim 1, further comparing the second image of the photomask with a reference image.

4. The inspection method of the photomask as claimed in claim 3, wherein the first image is the reference image.

5. The inspection method of the photomask as claimed in claim 1, wherein the common Z calibration map is generated by scanning the photomask along a plurality of scanning paths using the optical module of the first inspection system while the objective lens of the optical module is maintained in a common level and determining the focus of the objective lens at respective points on the scanning paths.

6. The inspection method of the photomask as claimed in claim 1, further adjusting a position and an orientation of the photomask by using an alignment mark on the photomask after loading the photomask on the stage of the first inspection system and after loading the photomask on the stage of the second inspection system.

7. The inspection method of the photomask as claimed in claim 1, further adjusting and calibrating an illuminated light emitted from a light source of the first inspection system before generating the common Z calibration map.

8. The inspection method of the photomask as claimed in claim 1, further adjusting and calibrating an illuminated light emitted from the light source of the second inspection system before capturing the second image of the photomask.

9. The inspection method of the photomask as claimed in claim 1, further generating another Z calibration map of a focus of an objective lens of an optical module with respect to the photomask using the second inspection system and comparing the common Z calibration map with the another Z calibration map.

10. An inspection method of a photomask, comprising:
    loading the photomask on a stage of a first inspection system;
    generating a Z calibration map of a focus of an objective lens of an optical module of the first inspection system with respect to the photomask by scanning the photomask through the optical module;
    storing the Z calibration map;
    unloading the photomask from the first inspection system;
    loading the photomask on a second inspection system;
    generating another Z calibration map of a focus of an objective lens of an optical module of the second inspection system with respect to the photomask;
    comparing the Z calibration map with the another Z calibration map to generate a compensation data;
    generating a common Z calibration map of a focus of an objective lens of an optical module with respect to a common photomask using the first inspection system; and
    capturing an image of the common photomask using the second inspection system by focusing the objective lens of the optical module of the second inspection system based on the common Z calibration map shared from the first inspection system and the compensation data.

11. The inspection method of the photomask as claimed in claim 10, further adjusting a position and an orientation of the photomask by using an alignment mark on the photomask after loading the photomask on a stage of the second inspection system.

12. The inspection method of the photomask as claimed in claim 10, further adjusting and calibrating an illuminated light emitted from a light source of the second inspection system before capturing the image of the common photomask using the second inspection system.

13. The inspection method of the photomask as claimed in claim 10, further capturing another image of the common photomask by using an image sensor of the first inspection system while an illuminated light of the first inspection system scans the common photomask by focusing the objective lens of the optical module of the first inspection system based on the common Z calibration map.

14. The inspection method of the photomask as claimed in claim 13, further comparing the image of the common photomask with the another image of the common photomask.

15. The inspection method of the photomask as claimed in claim 10, wherein the common Z calibration map is generated by scanning the common photomask along a plurality of scanning paths using the optical module of the first inspection system while the objective lens of the optical module of the first inspection system is maintained in a common level and determining the focus of the objective lens at respective points on the scanning paths.

16. The inspection method of the photomask as claimed in claim 10, further adjusting a position and an orientation of the photomask by using an alignment mark on the photomask after loading the photomask on the stage of the first inspection system.

17. The inspection method of the photomask as claimed in claim 10, further adjusting and calibrating an illuminated light emitted from a light source of the first inspection system after loading the photomask on the stage of the first inspection system.

18. The inspection method of the photomask as claimed in claim 10, further capturing an image of the photomask by using an image sensor of the first inspection system while an illuminated light of the first inspection system scans the photomask by focusing the objective lens of the optical module of the first inspection system based on the Z calibration map.

19. An inspection system, comprising:
a stage configured to carry a photomask;
a light source configured to emit a light;
an optical module located at a downstream of the light source and including an objective lens proximate to the stage;
an image sensor configured to capture an image of the photomask; and
a computing device communicated with the optical module and the image sensor, and comprising a controller and driver circuit and a data processor that are configured to store a common Z calibration map of a focus of the objective lens with respect to the photomask shared from another inspection system and store an image captured by the image sensor while driving the optical module to scan the photomask using the light of the light source by focusing the objective lens of the optical module based on the common Z calibration map of the focus of the objective lens with respect to the photomask.

20. The inspection system as claimed in claim 19, wherein the objective lens is a zoom lens.

* * * * *